(12) United States Patent
Robison et al.

(10) Patent No.: US 7,772,110 B2
(45) Date of Patent: Aug. 10, 2010

(54) ELECTRICAL CONTACTS FOR INTEGRATED CIRCUITS AND METHODS OF FORMING USING GAS CLUSTER ION BEAM PROCESSING

(75) Inventors: Rodney L. Robison, East Berne, NY (US); Douglas Trickett, Altamont, NY (US)

(73) Assignee: Tokyo Electron Limited, Tokyo (JP)

( * ) Notice: Subject to any disclaimer, the term of this patent is extended or adjusted under 35 U.S.C. 154(b) by 216 days.

(21) Appl. No.: 11/864,334

(22) Filed: Sep. 28, 2007

(65) Prior Publication Data

US 2009/0085211 A1   Apr. 2, 2009

(51) Int. Cl.
*H01L 21/4763* (2006.01)
(52) U.S. Cl. ............... 438/627; 438/642; 438/523; 257/E21.147
(58) Field of Classification Search .......... 438/627, 438/643, 528, 514–524; 257/E21.147, 751
See application file for complete search history.

(56) References Cited

U.S. PATENT DOCUMENTS

| | | | |
|---|---|---|---|
| 5,024,716 A | 6/1991 | Sato | |
| 5,480,684 A * | 1/1996 | Sandhu | ............ 427/531 |
| 5,990,493 A | 11/1999 | Gardner et al. | |
| 6,394,760 B1 | 5/2002 | Tell | |
| 6,495,474 B1 * | 12/2002 | Rafferty et al. | ............ 438/766 |
| 6,693,356 B2 | 2/2004 | Jiang et al. | |
| 7,063,097 B2 | 6/2006 | Arno et al. | |
| 7,270,848 B2 | 9/2007 | Suzuki et al. | |
| 2004/0113093 A1 | 6/2004 | Mack | |
| 2005/0009334 A1 | 1/2005 | Shingubara et al. | |
| 2005/0153544 A1 * | 7/2005 | Suh et al. | ............ 438/643 |
| 2006/0097185 A1 | 5/2006 | Mack | |
| 2006/0105570 A1 | 5/2006 | Hautala et al. | |
| 2006/0110530 A1 | 5/2006 | Suzuki et al. | |
| 2007/0054487 A1 * | 3/2007 | Ma et al. | ............ 438/681 |
| 2007/0066081 A1 | 3/2007 | Cheng et al. | |
| 2007/0148826 A1 | 6/2007 | Yang et al. | |
| 2007/0222078 A1 | 9/2007 | Furuya | |

FOREIGN PATENT DOCUMENTS

WO    03046978 A2    6/2003
WO    2006052958 A2    5/2006

OTHER PUBLICATIONS

European Patent Office, International Search Report and Written Opinion received in related International Patent Application No. PCT/US2008/076606 dated Dec. 15, 2008, 16 pp.

(Continued)

*Primary Examiner*—Davienne Monbleau
*Assistant Examiner*—Matthew Reames
(74) *Attorney, Agent, or Firm*—Wood, Herron & Evans, LLP

(57) ABSTRACT

Embodiments of the invention describe electrical contacts for integrated circuits and methods of forming using gas cluster ion beam (GCIB) processing. The electrical contacts contain a fused metal-containing layer formed by exposing a patterned structure to a gas cluster ion beam containing a transition metal precursor or a rare earth metal precursor.

9 Claims, 12 Drawing Sheets

OTHER PUBLICATIONS

U.S. Patent and Trademark Office, International Search Report and Written Opinion received in related International Application No. PCT/US2008/077797 dated Dec. 4, 2008, 10 pp.

International Bureau of WIPO, International Preliminary Report on Patentability issued for corresponding International Application No. PCT/US2008/077797 dated Mar. 30, 2010, 8 pp.

* cited by examiner

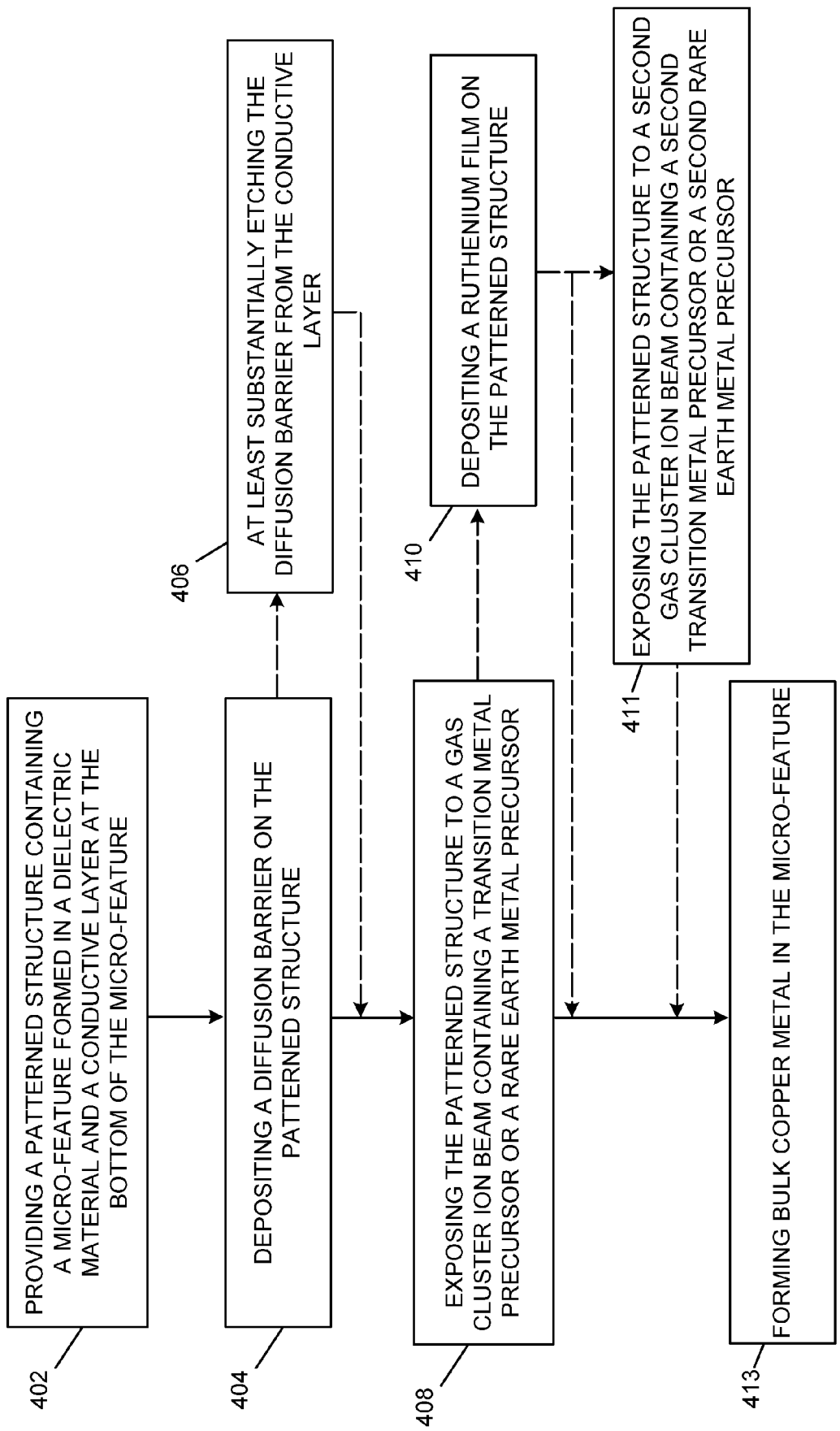

ELECTRICAL CONTACTS FOR INTEGRATED CIRCUITS AND METHODS OF FORMING USING GAS CLUSTER ION BEAM PROCESSING

FIELD OF THE INVENTION

The field of the invention relates generally to the field of semiconductor integrated circuit manufacturing and, more specifically but not exclusively, relates to forming electrical contacts containing fused metal-containing layers using gas cluster ion beam (GCIB) processing.

BACKGROUND OF THE INVENTION

An integrated circuit contains various semiconductor devices and a plurality of conducting metal paths that provide electrical power to the semiconductor devices and allow these semiconductor devices to share and exchange information. Within an integrated circuit, metal layers are stacked on top of one another using intermetal or interlayer dielectric layers that insulate the metal layers from each other. Metal layers typically occupy etched pathways in the interlayer dielectric. Normally, each metal layer must form an electrical contact to at least one additional metallization layer or contact layer. Such electrical contact is achieved by etching a hole in the interlayer dielectric that separates the metal layers or a metal layer and a doped substrate region, and filling the resulting via with a metal (plug) to create a vertical interconnect structure. A "via" normally refers to any micro-feature such as a hole, line or other similar feature formed within a dielectric layer that provides an electrical connection through the dielectric layer to a conductive layer underlying the dielectric layer. Similarly, micro-features containing metal layers connecting two or more vias are normally referred to as trenches.

Tungsten (W) plug metallization is widely used for vertical interconnect structures of various metal layers in integrated circuit fabrication. The scaling of interconnect structures, including contact size, results in an increase in contact resistivity. Replacing the conventional W plug with a lower contact resistivity metal such as copper (Cu) provides significant gains in switching delay (RC-delay) and power consumption. Furthermore, Cu plugs alleviate the rapid rise in resistance as W contacts scale below about 70 nanometers (nm=$10^{-9}$ m) in diameter. Metal plugs are surrounded by barrier films that separate the metal plugs from dielectric materials and other materials in the semiconductor device. Cu cannot be put in direct contact with dielectric materials since Cu has poor adhesion to the dielectric materials and Cu is known to easily diffuse into common integrated circuit materials such as silicon and dielectric materials where Cu is a mid-band gap impurity. Furthermore, oxygen can diffuse from an oxygen-containing dielectric material into Cu, thereby decreasing the electrical conductivity of the Cu metal. Therefore, a diffusion barrier material is formed on dielectric materials and other materials in the integrated circuits to surround the Cu and prevent diffusion of the Cu into the integrated circuit materials.

One area of concern is contact resistivity for electrical contacts at the bottom of micro-features. The presence of diffusion barrier material and/or other layers at the bottom of the micro-features can result in high contact resistivity and weak adhesion between the various materials. Thus, new processing methods are needed for improving electrical contacts for micro-features containing Cu.

BRIEF DESCRIPTION OF THE DRAWINGS

Embodiments of the invention are illustrated by way of examples and not as a limitation in the figures of the accompanying drawings.

FIGS. 4A-4B are process flow diagrams describing methods for forming electrical contacts for an integrated circuit according to embodiments of the invention;

DETAILED DESCRIPTION OF SEVERAL EMBODIMENTS

Figure 1A:
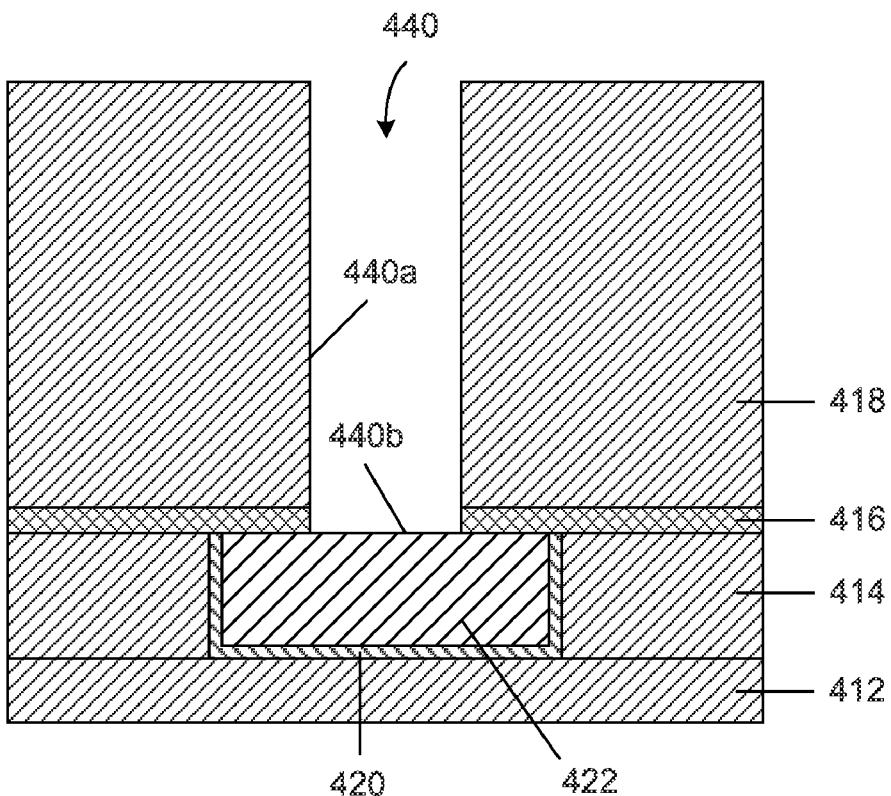
FIGS. 1A-1F schematically show a method for forming an electrical contact for an integrated circuit according to an embodiment of the invention.

Formation of an electrical contact for an integrated circuit is disclosed in various embodiments. The electrical contact includes a patterned structure containing a micro-feature formed in a dielectric material and a conductive layer at the bottom of the micro-feature, a diffusion barrier formed on a sidewall of the micro-feature, bulk Cu metal in the micro-feature, and a fused metal-containing layer between the conductive layer and the bulk Cu metal, where the fused metal-containing layer is formed by exposing the patterned structure to a gas cluster ion beam (GCIB) containing a transition metal precursor or a rare earth metal precursor. The transition metal precursor can, for example, contain a transition metal selected from scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), and mercury (Hg). The rare earth metal precursor can, for example, contain a rare earth metal selected from yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

In general, GCIB's may be used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. Exemplary energies per cluster ion can be between about 1 keV and about 30 keV. The ion clusters disintegrate on impact with the work piece (substrate). Each individual molecule in a particular disintegrated ion cluster carries only a small fraction of the total cluster energy, typically only a few eV per molecule. Consequently, the impact effects of large ion clusters are substantial, but are limited to a very shallow surface region, often only a few nm deep, for example between 5 and 30 nm deep, depending on the processing conditions (e.g., acceleration voltage). This makes gas cluster ions effective for a variety of surface modification processes, but without the tendency to produce deep implantation and deep subsurface damage that is characteristic of conventional ion beam processing and plasma processing.

One skilled in the relevant art will recognize that the various embodiments may be practiced without one or more of the specific details, or with other replacement and/or additional methods, materials, or components. In other instances, well-known patterned substrates, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

There is a general need for providing electrical contacts with low electrical resistance, improved resistance to electro migration, and good adhesion between the various materials that form the integrated circuit. The current inventors have realized that these electrical and material properties can be achieved using GCIB processing to incorporate transition metals or rare earth metals into shallow surface regions of electrical contacts, without many of the drawbacks encountered in conventional ion beam processing or plasma processing. In the following description, in order to facilitate a thorough understanding of the various embodiments of the invention and for purposes of explanation and not limitation, specific details are set forth, such as a particular geometry of patterned substrates. However, it should be understood that the invention may be practiced in other embodiments that depart from these specific details.

FIGS. 1A-1F schematically show a method for forming an electrical contact for an integrated circuit according to an embodiment of the invention. FIG. 1A schematically shows a cross-sectional view of a patterned structure containing a micro-feature 440 formed in a dielectric material 418 over a conductive layer 422. Methods for forming the patterned structure are well known to those skilled in the art. The micro-feature 440 includes a sidewall 440a and a surface 440b of the conductive layer 422. The patterned structure further contains dielectric layers 412 and 414, a barrier layer 420 surrounding the conductive layer 422, and an etch stop layer 416. The conductive layer 422 can, for example, be a first metallization layer containing Cu or W, including the elements alone or compounds thereof.

According to an embodiment of the invention, the micro-feature 440 can be a via having an aspect ratio (depth/width) greater than or equal to about 2:1, for example 3:1, 4:1, 5:1, 6:1, 12:1, 15:1, or higher. The via can have a width of about 200 nm or less, for example 150 nm, 100 nm, 65 nm, 45 nm, 32 nm, 22 nm, or less. However, embodiments of the invention are not limited to these aspect ratios or via widths, as other aspect ratios and via widths may be utilized.

Figure 1B:
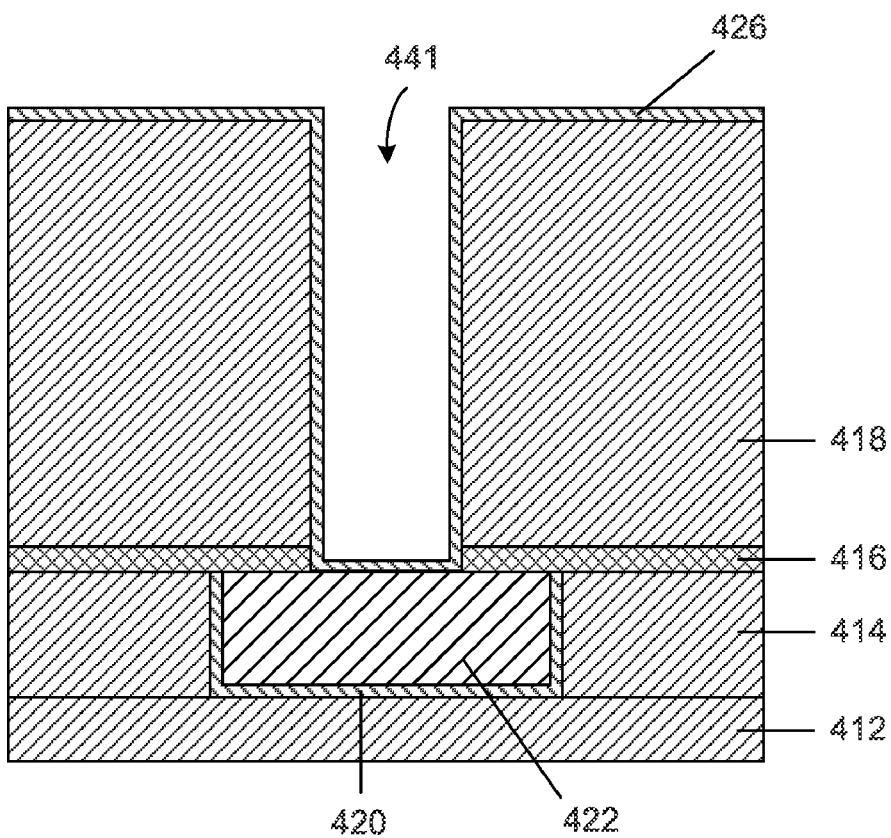

In FIG. 1B, a diffusion barrier 426 is deposited on the patterned structure, including on the sidewall 440a and surface 440b of the micro-feature 440 in FIG.1A to form micro-feature 441. The diffusion barrier 426 can, for example, include a Ta-containing film (e.g., TaN, TaCN, TaC, Ta, or a combination thereof), a Ti-containing film (e.g., TiN, TiCN, TiC, Ti, or a combination thereof), or a W-containing film (e.g., WN, WCN, WC, W, or a combination thereof. A thickness of the diffusion barrier 426 can, for example, be between about 1 nm and about 10 nm, or between about 2 nm and about 5 nm, for example about 4 nm. An exemplary processing system that may be utilized for depositing the diffusion barrier 426 is described in FIG. 5.

Figure 1C:
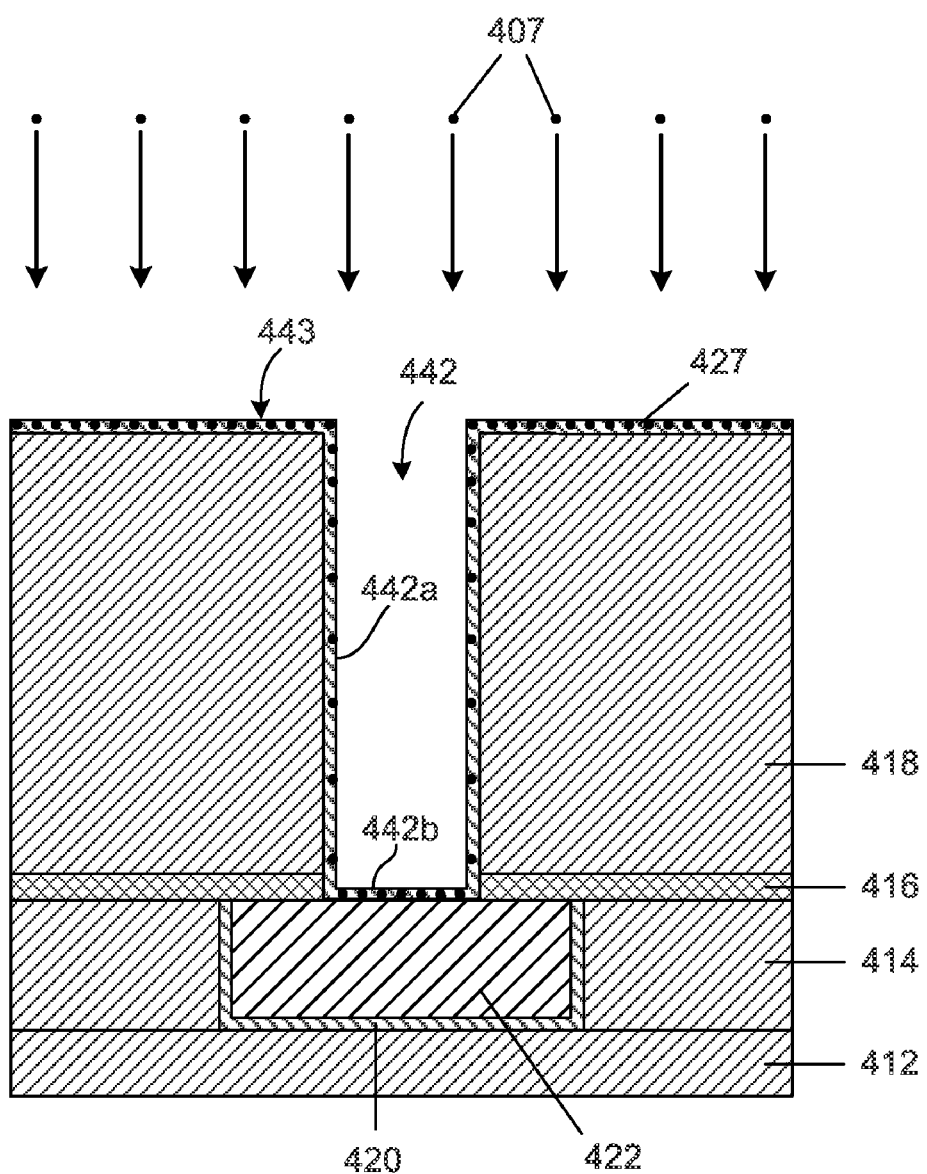

In FIG. 1C, the patterned structure is exposed to a GCIB 407 containing a transition metal precursor or a rare earth metal precursor to incorporate a transition metal or a rare earth metal into the diffusion barrier 426 of the micro-feature 441 in FIG. 1B to form micro-feature 442. The exposure incorporates (fuses) a transition metal (from the transition metal precursor) or a rare earth metal (from the rare earth metal precursor) into the diffusion barrier 426 to form a fused metal-containing layer 427 containing the diffusion barrier element or compound and the transition metal or rare earth metal. In one embodiment, the transition metal can include Ru, Pt, Ir, or Rh, or a combination of two or more thereof. An exemplary GCIB processing apparatus that may be utilized for generating the GCIB 407 is described in FIG. 6.

As schematically depicted in FIG. 1C, concentration of the transition metal or rare earth metal from the GCIB 407 in the fused metal-containing layer 427 is highest in the field area 443 around the micro-feature 442 and in the contact area 442b at the bottom of the micro-feature 442, and lowest on the sidewall 442a of the micro-feature 442. This is due to the high directionality of the GCIB 407 exposure schematically depicted in FIG. 1C. Concentration and depth profile of the transition metal or rare earth metal in the fused metal-containing layer 427 can be adjusted and controlled by selecting the exposure conditions, including the energy of the GCIB 407, exposure times, and optionally annealing conditions following the GCIB exposure. A depth profile of the transition metal or the rare earth metal can be substantially uniform throughout a thickness of the fused metal-containing layer 427, or alternately, the concentration of the metal can be non-uniform throughout the thickness of the fused metal-containing layer 427. Although not shown in FIG. 1C, the transition metal or rare earth metal may also be incorporated into the dielectric material 418 and the conductive layer 422, since the impact effects of the GCIB 407 can reach a depth greater than a thickness of the diffusion barrier 426.

Figure 1D:
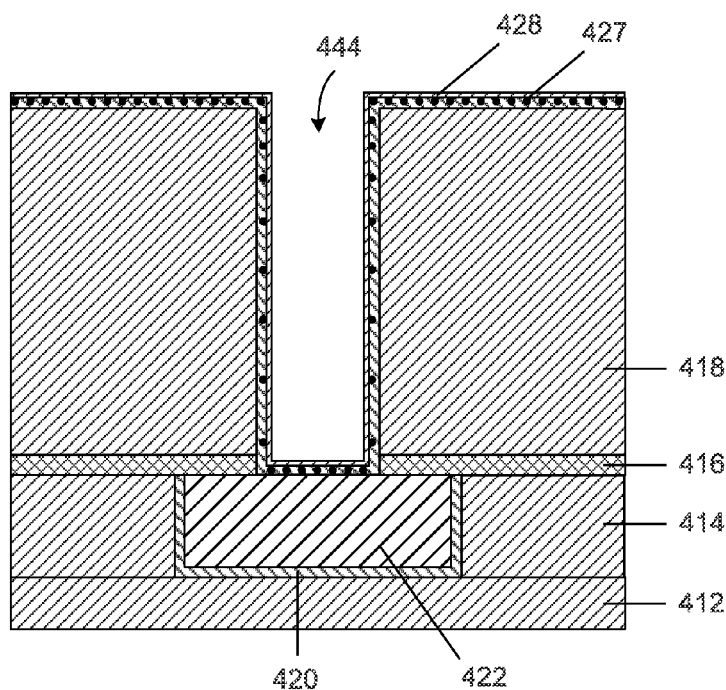

According to one embodiment of the invention, a Ru film 428 may be deposited on the fused metal-containing layer 427. FIG. 1D shows the Ru film 428 deposited on the fused metal-containing layer 427 to form micro-feature 444. A thickness of the Ru film 428 can, for example, be between about 0.5 nm and about 5 nm, or between about 1 nm and about 3 nm, for example about 2 nm. In one example, the Ru film 428 may be deposited by chemical vapor deposition (CVD) using a $Ru_3(CO)_{12}$ precursor and a CO carrier gas. The Ru film 428 can be deposited with excellent conformality over high-aspect ratio micro-features. According to another embodiment of the invention, the Ru film 428 may be omitted.

Figure 1E:
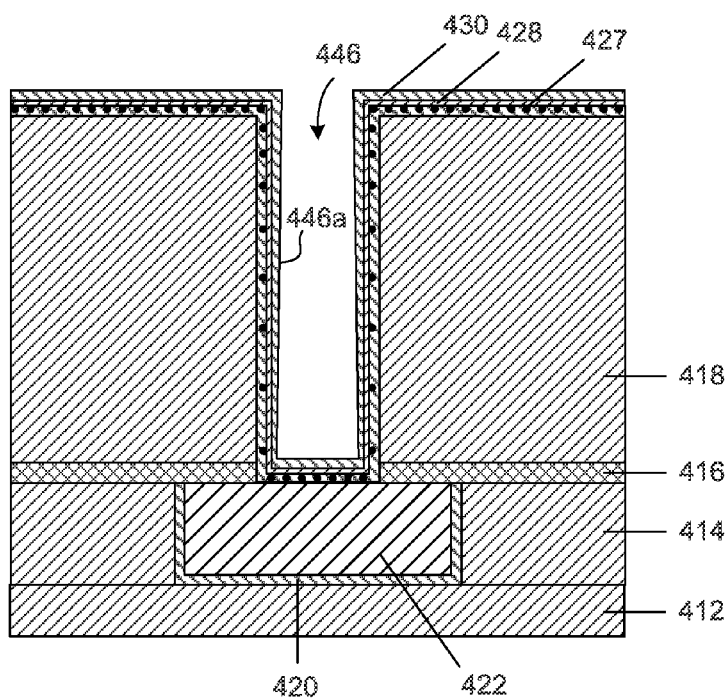

In FIG. 1E, a Cu seed layer 430 is deposited over the patterned structure to form micro-feature 446. The Cu seed layer 430 may be non-conformally deposited over the patterned structure with a minimum thickness on the sidewall 446a of the micro-feature 446. The Cu seed layer 430 may be utilized as a Cu growth surface for a subsequent Cu plating process to form bulk Cu metal in the micro-feature 446. A thickness of the Cu seed layer 430 can be between about 0.5 nm and about 5 nm, or between about 1 nm and about 3 nm, for example about 2 nm. According to another embodiment of the invention, the Cu seed layer 430 may be omitted.

Figure 1F:
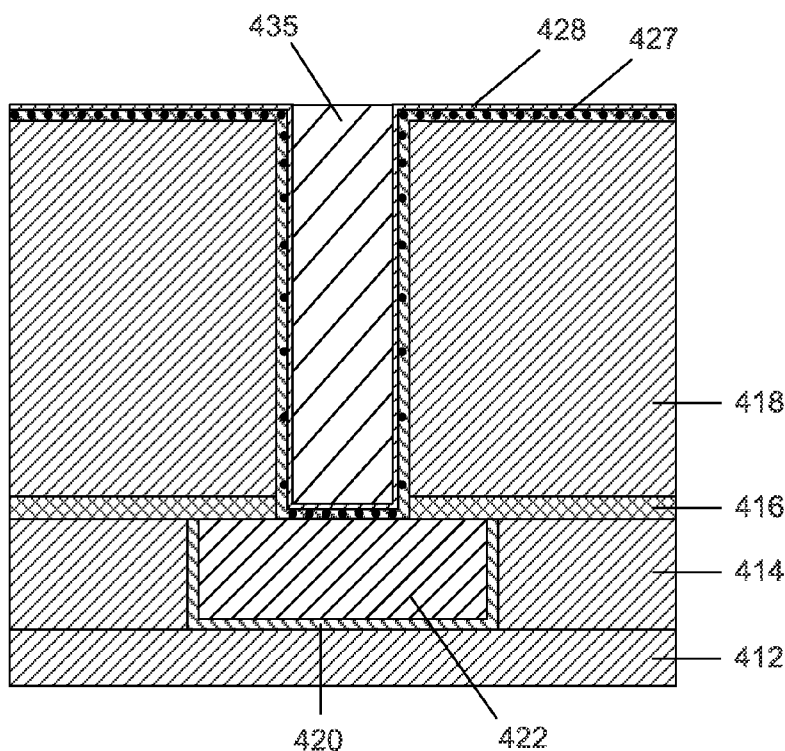

In FIG. 1F, the micro-feature opening 446 is filled with bulk Cu metal 435, for example by a Cu plating process, and excess Cu metal is then removed from the patterned structure, for example by a chemical mechanical polishing (CMP) process. The Cu plating process may include an electrochemical plating process or an electroless plating process. Although not shown in FIG. 1F, the CMP process may at least partially remove the Ru film 428 and optionally the fused metal-containing layer 427 from the field area of the patterned structure.

According to another embodiment of the invention, a second fused metal-containing layer may be formed on the first fused metal-containing layer 427 in FIG. 1D prior to the bulk Cu metal filling. The second fused metal-containing layer may be formed by exposing the Ru film 428 to a second GCIB containing a second transition metal precursor or a second rare earth precursor to incorporate a second transition metal or a second rare earth metal into the Ru film 428. The first and second transition metals may be the same or, alternately, they may be different. Furthermore, first and second rare earth metals may be the same or, alternately, they may be different. In this embodiment, each of the diffusion barrier 426 and Ru film 428 are separately exposed to GCIBs. Depending on the GCIB exposure conditions, the GCIB impact effects may be selected to reach a depth greater than a thickness of the Ru film 428, thereby incorporating the second transition metal or the second rare earth metal into the fused metal-containing layer 427, and even into the conductive layer 422, during the GCIB exposure of the Ru film 428. As described above, concentration and depth profile of the transition metals or rare earth metals may be adjusted and controlled by selecting the exposure conditions, including the energy of the GCIB exposure, exposure times, and optionally annealing conditions following the GCIB exposure.

Figure 1G:
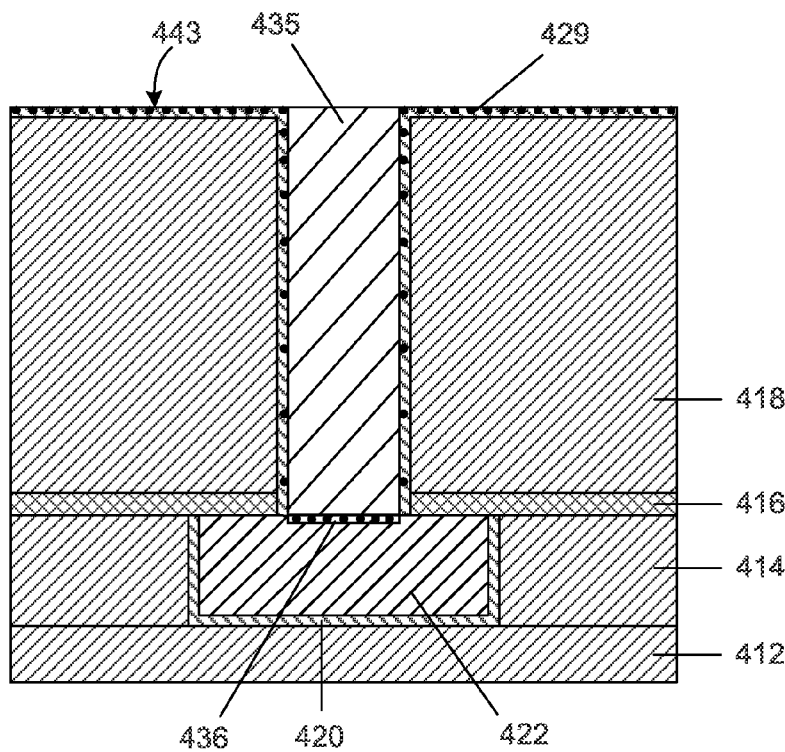
FIGS. 1G-1L show cross-sectional views of other electrical contacts for an integrated circuit according to embodiments of the invention.
Figure 1H:
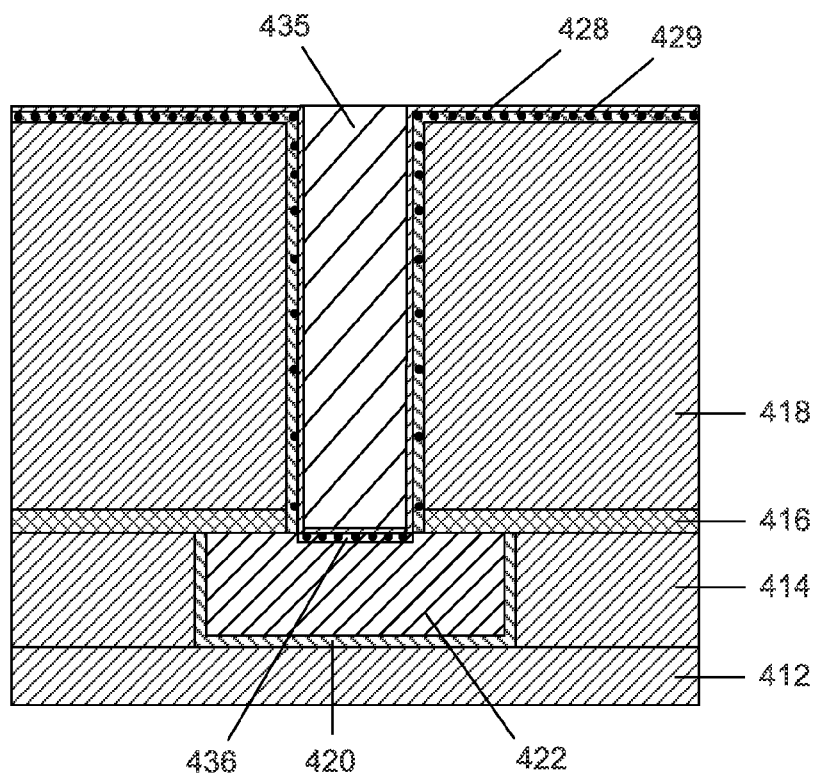

Referring back to FIG. 1B, according to another embodiment of the invention, the diffusion barrier 426 may be at least partially etched from the conductive layer 422 by a sputter etch process prior to the GCIB exposure. Referring now to FIG. 1G, after etching of the diffusion barrier 426, the GCIB exposure may be utilized to form a first fused metal-containing layer 429 similar to the fused metal-containing layer 427 depicted in FIG. 1C, and a second fused metal-containing layer 436 by incorporating a transition metal or a rare earth metal into the conductive layer 422. In the embodiment depicted in FIG. 1G, the diffusion barrier 426 has been completely etched from the conductive layer 422 prior to the GCIB exposure, thereby directly contacting the bulk Cu metal 435 and the conductive layer 422 through the second fused metal-containing layer 436. Although not shown in FIG. 1G, etching of the diffusion barrier 426 from the conductive layer 422 and/or subsequent CMP processing may at least partially remove the diffusion barrier 426 and the first fused metal-containing layer 429 from other surfaces of the patterned structure, such as the field area 443. According to another embodiment of the invention, a Ru film 428 may be deposited on the first and second fused metal-containing layers 429,436 before filling with bulk Cu metal 435. This is schematically shown in FIG. 1H. According to yet another embodiment of the invention, now shown, an upper fused metal-containing layer may be formed on the second fused metal-containing layer 436 by exposing the Ru film 428 in FIG. 1H to a GCIB containing a second transition metal precursor or a second rare earth precursor to incorporate a second transition metal or a second rare earth metal into the Ru film 428. The first and second transition metals may be the same or, alternately, they may be different. Furthermore, first and second rare earth metals may be the same or, alternately, they may be different.

Figure 1I:
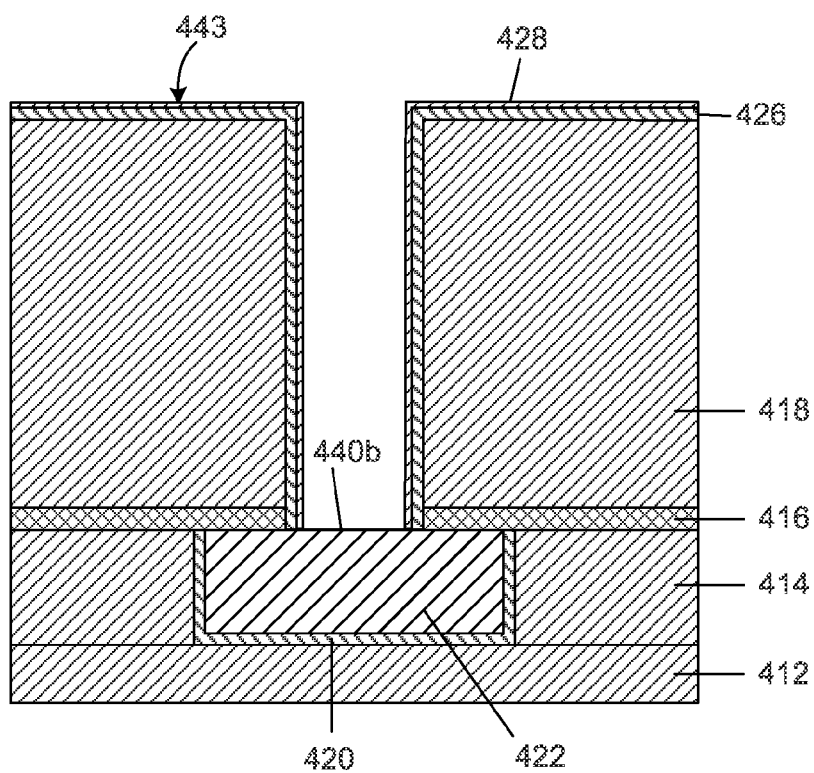
Figure 1J:
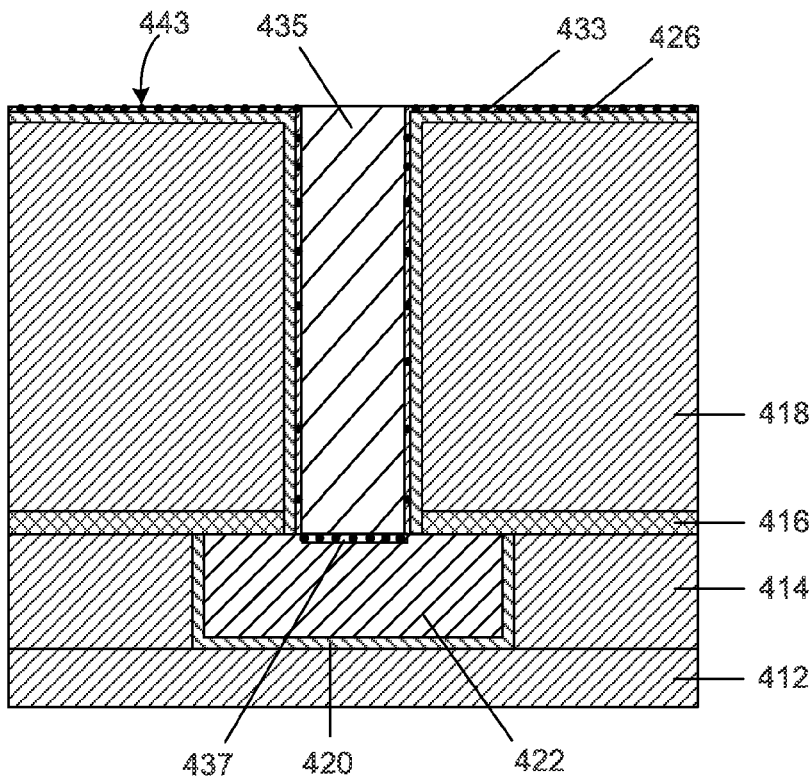

According to another embodiment of the invention, a Ru film 428 may be deposited on the patterned structure shown in FIG. 1B, and subsequently, the diffusion barrier 426 and the Ru film 428 may be at least substantially etched from the conductive layer 422 by a sputter etch process prior to the GCIB exposure. FIG. 1I shows an electrical contact where the diffusion barrier 426 and the Ru film 428 have been completely etched from the surface 440b of conductive layer 422 in the microfeature opening prior to a GCIB exposure. As shown in FIG. 1J, the GCIB exposure forms a first fused metal-containing layer 433 by incorporating a transition metal or a rare earth metal into the Ru film 428, and a second fused metal-containing layer 437 by incorporating a transition metal or rare earth metal into the conductive layer 422. Subsequently, bulk Cu metal 435 is formed in the microfeature. Although not shown in FIGS. 1I or 1J, etching of the diffusion barrier 426 and the Ru film 428 from the conductive layer 422 and/or CMP processing may at least partially remove the diffusion barrier 426, the Ru film 428, and the first fused metal-containing layer 433 from other surfaces of the patterned structure, such as the field area 443.

Figure 1K:
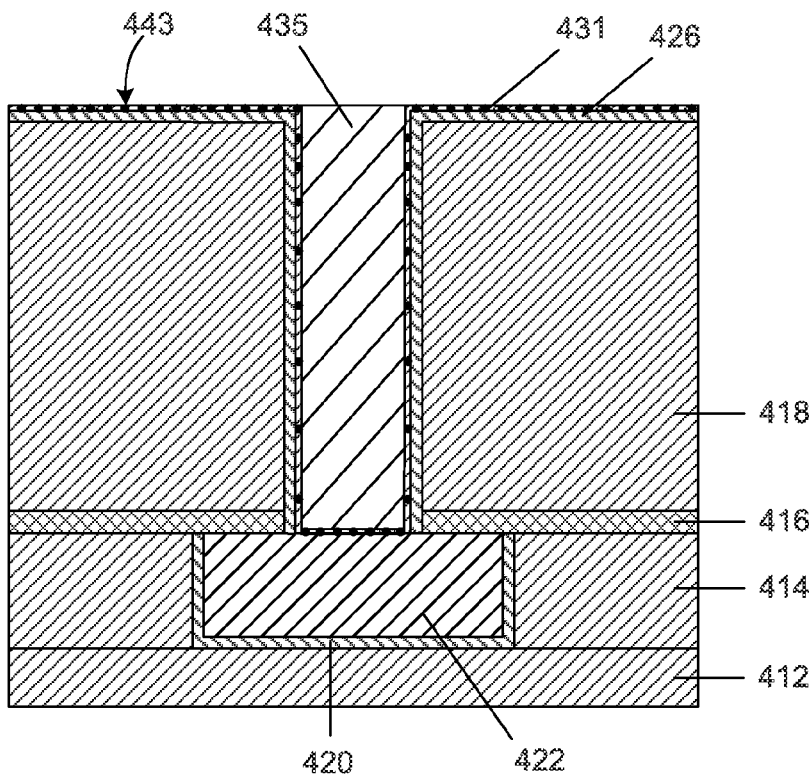

Referring back to FIG. 1B, according to another embodiment of the invention, the diffusion barrier 426 may be at least partially etched from the surface 440b of conductive layer 422 by a sputter etch process prior to depositing the Ru film 428 and performing a GCIB exposure. Referring now to FIG. 1K, after the sputter etch process and deposition of the Ru film 428 on the diffusion barrier 426 and the conductive layer 422, a GCIB exposure may be utilized to form a fused metal-containing layer 431 by incorporating a transition metal or a rare earth metal into the Ru film 428. In FIG. 1K, the diffusion barrier 426 has been completely etched from surface 440b of the conductive layer 422 prior to deposition of the Ru film 428. Subsequently, bulk Cu metal 435 is formed in the micro-feature. Although not shown in FIG. 1K, removal of the diffusion barrier 426 from the conductive layer 422 and/or the CMP processing may at least partially remove the diffusion barrier 426 and the fused metal-containing layer 431 from other surfaces of the patterned structure, such as the field area 443.

Figure 1L:
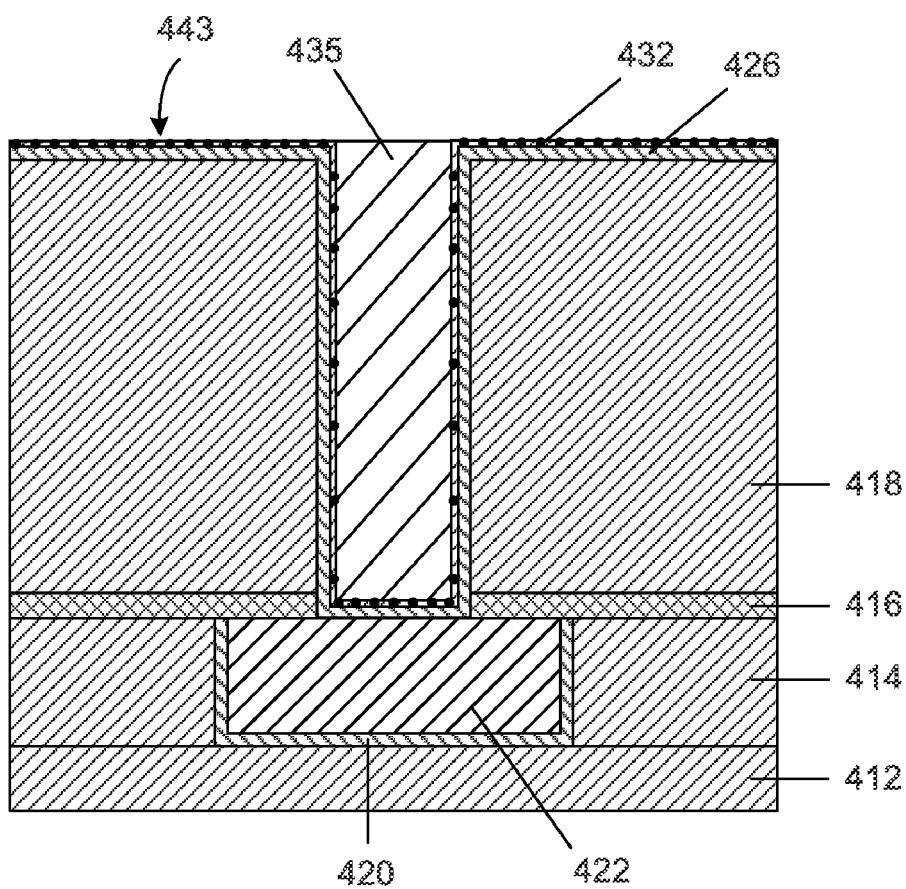

According to another embodiment of the invention, a Ru film 428 may be deposited on the patterned structure shown in FIG. 1B, and subsequently, a GCIB exposure performed, followed by formation of bulk Cu metal in the micro-feature. FIG. 1L shows an electrical contact containing a fused metal-containing layer 432 formed by incorporating a transition metal or a rare earth metal into the Ru film 428 and bulk Cu metal 435 in the micro-feature. Although not shown in FIG. 1L, the CMP process may at least partially remove the diffusion barrier 426 and the fused metal-containing layer 432 from surfaces of the patterned structure, such as the field area 443.

Although not shown in FIGS. 1J-1L, a transition metal or a rare earth metal may be incorporated into the diffusion barrier 426 during the GCIB exposure to the Ru film 428 since the GCIB impact effects can reach a depth greater than a thickness of the fused metal-containing layers 433, 431, and 432. Furthermore, although not shown in FIGS. 1K and 1L, a transition metal or a rare earth metal may be incorporated into the conductive layer 422 during the GCIB exposure to the Ru film 428.

Figure 2:
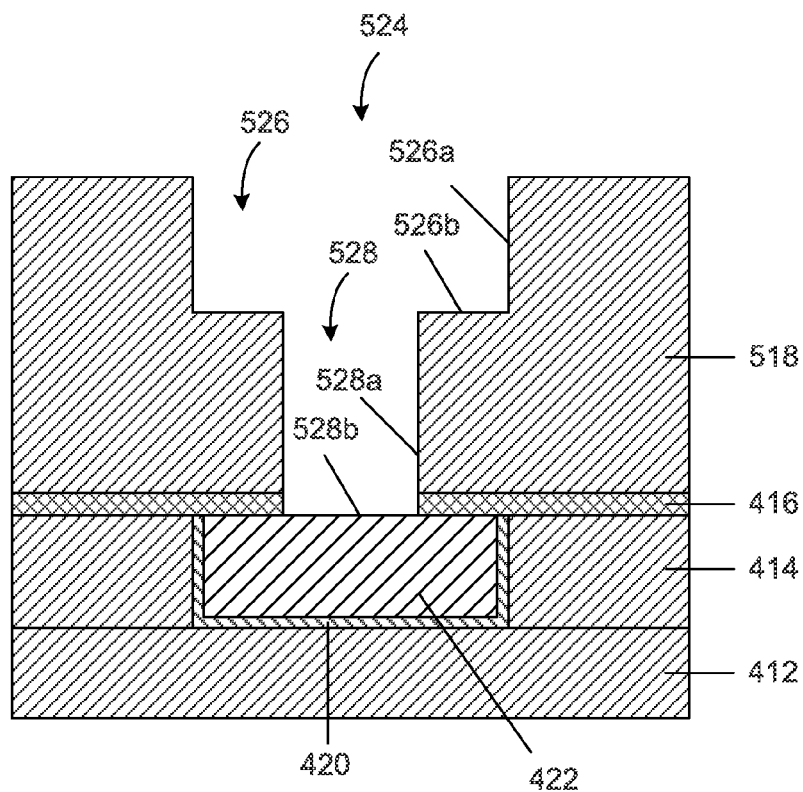
FIG. 2 schematically shows a cross-sectional view of a patterned structure according to an embodiment of the invention.
Figure 3:
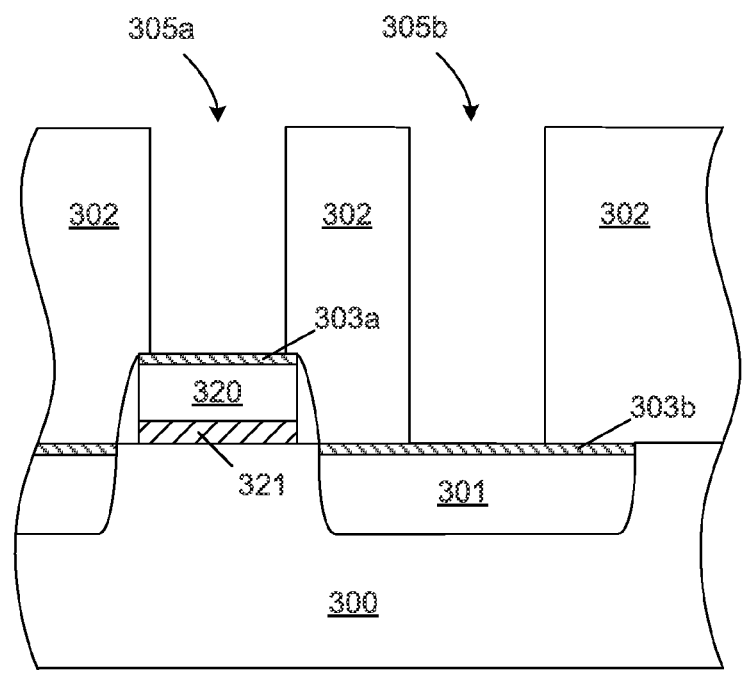
FIG. 3 schematically shows a cross-sectional view of a patterned structure according to another embodiment of the invention.

An exemplary patterned structure was illustrated and described above in FIG. 1A, but embodiments of the invention may be applied to other types of patterned structures found in integrated circuit design. FIGS. 2 and 3 schematically show cross-sectional views of other patterned structures according to additional embodiments of the invention. As will be appreciated by one of ordinary skill in the art, embodiments of the invention can be readily applied to the patterned structures depicted in FIGS. 2 and 3.

FIG. 2 schematically shows a cross-sectional view of a patterned structure according to another embodiment of the invention. The patterned structure depicted contains a dual damascene feature 524 formed over conductive layer 422. The dual damascene feature 524 contains a via 528 having sidewall and bottom surfaces 528a and 528b, respectively, and a trench 526 formed in dielectric material 518, where the trench 526 contains sidewall and bottom surfaces 526a and 526b, respectively. The trench 526 may be used for an upper conductive interconnect structure and the via 528 connects the trench 526 to the conductive layer 422. The patterned structure further contains dielectric layers 412 and 414, barrier layer 420 surrounding the conductive layer 422, and etch stop layer 416.

FIG. 3 schematically shows a cross-sectional view of a patterned structure according to another embodiment of the invention. The patterned structure contains a micro-feature 305a formed in a dielectric film 302 and a conductive layer 303a formed on a gate electrode 320 at the bottom of the micro-feature 305a. The gate electrode 320 is part of a gate structure that further contains a gate dielectric film 321. The gate dielectric film 321 can contain $SiO_2$, $SiO_xN_y$, $SiN_y$, or a high dielectric constant (high-k) material having a dielectric constant greater than that of $SiO_2$ (k~3.9), or a combination thereof. High-k materials can include metal oxides, metal oxynitrides, and their silicates, for example $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or $BaO$, or combinations of two or more thereof.

Furthermore, the patterned structure in FIG. 3 contains a micro-feature 305b formed in the dielectric film 302 and a conductive layer 303b formed on a doped substrate region 301 (e.g., a drain or a source region) in the substrate 300 at the bottom of the micro-feature 305b. The substrate 300 can, for example, be a 200 mm Si wafer, a 300 mm Si wafer, or an even larger Si wafer. The dielectric film 302 can contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, and/or halogens, either as dense or porous materials. According to an embodiment of the invention, the micro-features 305a, 305b can be vias with aspect ratios (depth/width) greater than or equal to about 2, for example 3, 4, 5, 6, 7, 12, 15, or higher. The vias can have widths of about 200 nm or less, for example 150 nm, 100 nm, 65 nm, 45 nm, 32 nm, 20 nm, or lower. In one example, the micro-features 305a,305b can be 45 nm wide vias with aspect ratios of about 7. However, embodiments of the invention are not limited to these aspect ratios or via widths, as other aspect ratios or via widths may be utilized. The conductive layers 303a and 303b can include silicide contact layers that provide thin stable electrical contacts and can, for example, contain $CoSi_2$, PtSi, $Pd_2Si$, $TiSi_2$, $WSi_2$, $NiSi_2$, or $TaSi_2$, or a combination of two or more thereof. One combination may contain PtNiSi that allows the use of higher processing temperatures than $NiSi_2$. Processing methods for forming the patterned structures depicted in FIGS. 2 and 3 are well known to one skilled in the art.

FIG. 4A is a process flow diagram describing a method for forming an electrical contact according to an embodiment of the invention. In block 402, a patterned structure is provided in a process chamber, where the patterned structure contains a micro-feature formed in a dielectric material and a conductive layer at the bottom of the micro-feature. In block 404, a diffusion barrier is deposited on the patterned structure, including along a sidewall of the micro-feature and on the conductive layer. In block 408, the patterned structure is exposed to a gas cluster ion beam containing a transition metal precursor or a rare earth metal precursor, where the exposing incorporates a transition metal or a rare earth metal into the diffusion barrier to form a fused metal-containing layer. In block 413, bulk Cu metal is formed in the micro-feature.

According to another embodiment of the invention, the method described in FIG. 4A further includes, in optional block 410, depositing a Ru film on the fused metal-containing layer prior to forming bulk Cu metal in the micro-feature. An exemplary electrical contact is depicted in FIG. 1F. According to yet another embodiment of the invention, in which block 410 is included, a second fused metal-containing layer may be formed, as in optional block 411, by exposing the patterned structure, and in particular the Ru film, to a second GCIB containing a second transition metal precursor or a second rare earth precursor to incorporate a second transition metal or a second rare earth metal into the Ru film.

According to yet another embodiment of the invention, the method described in FIG. 4A further includes, in optional block 406, at least substantially etching the diffusion barrier from the conductive layer, and exposing the patterned structure to a gas cluster ion beam containing a transition metal precursor or a rare earth metal precursor, where the exposing incorporates a transition metal or a rare earth metal into the conductive layer to form a fused metal-containing layer. An exemplary electrical contact is depicted in FIG. 1G. According to another embodiment of the invention, in which block 406 is included, a Ru film may be deposited, as in block 410, on the fused metal-containing layer prior to forming bulk Cu metal in the micro-feature. An exemplary electrical contact is depicted in FIG. 1H. According to yet another embodiment of the invention, in which blocks 406 and 410 are included, a second fused metal-containing layer may be formed, as in block 411, by exposing the Ru film to a second GCIB containing a second transition metal precursor or a second rare earth precursor to incorporate a second transition metal or a second rare earth metal into the Ru film.

Figure 4B:
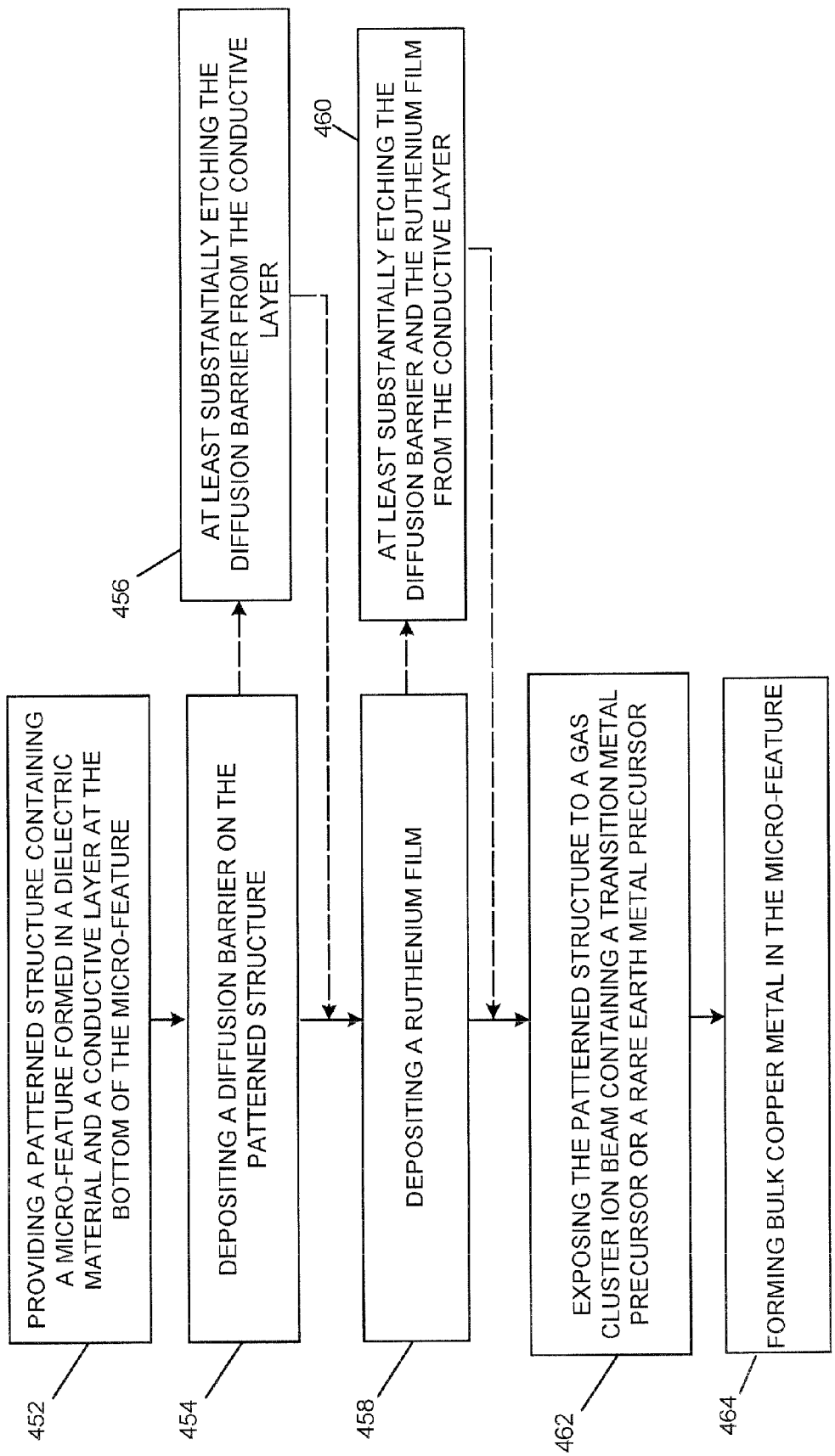

FIG. 4B is a process flow diagram describing a method for forming an electrical contact according to an embodiment of the invention. In block 452, a patterned structure is provided in a process chamber, where the patterned structure contains a micro-feature formed in a dielectric material and a conductive layer at the bottom of the micro-feature. In block 454, a diffusion barrier is deposited on the patterned structure, including along a sidewall of the micro-feature and on the conductive layer. In block 458, a Ru film is deposited on the diffusion barrier. In block 462, the patterned structure is exposed to a gas cluster ion beam containing a transition metal precursor or a rare earth metal precursor, where the exposing incorporates a transition metal or a rare earth metal into the Ru film to form a fused metal-containing layer. In block 464, bulk Cu metal is formed in the micro-feature. An exemplary electrical contact is depicted in FIG. 1L.

According to another embodiment of the invention, the method described in FIG. 4B further includes, in optional block 460, at least substantially etching the diffusion barrier and the Ru film from the conductive layer, and block 462 includes exposing the patterned structure to a gas cluster ion beam containing a transition metal precursor or a rare earth element precursor, where the exposing incorporates a transition metal or a rare earth metal into the conductive layer to form a fused metal-containing layer. An exemplary electrical contact is depicted in FIG. 1J.

According to yet another embodiment of the invention, the method described in FIG. 4B further includes, in optional block 456, at least substantially etching the diffusion barrier from the conductive layer, block 458 includes depositing a Ru film on the diffusion barrier and on the conductive layer, and block 462 includes exposing the patterned structure to a gas cluster ion beam containing a transition metal precursor or a rare earth metal precursor, where the exposing incorporates a transition metal or a rare earth metal into the Ru film to form a fused metal-containing layer. An exemplary electrical contact is depicted in FIG. 1K.

Figure 5:
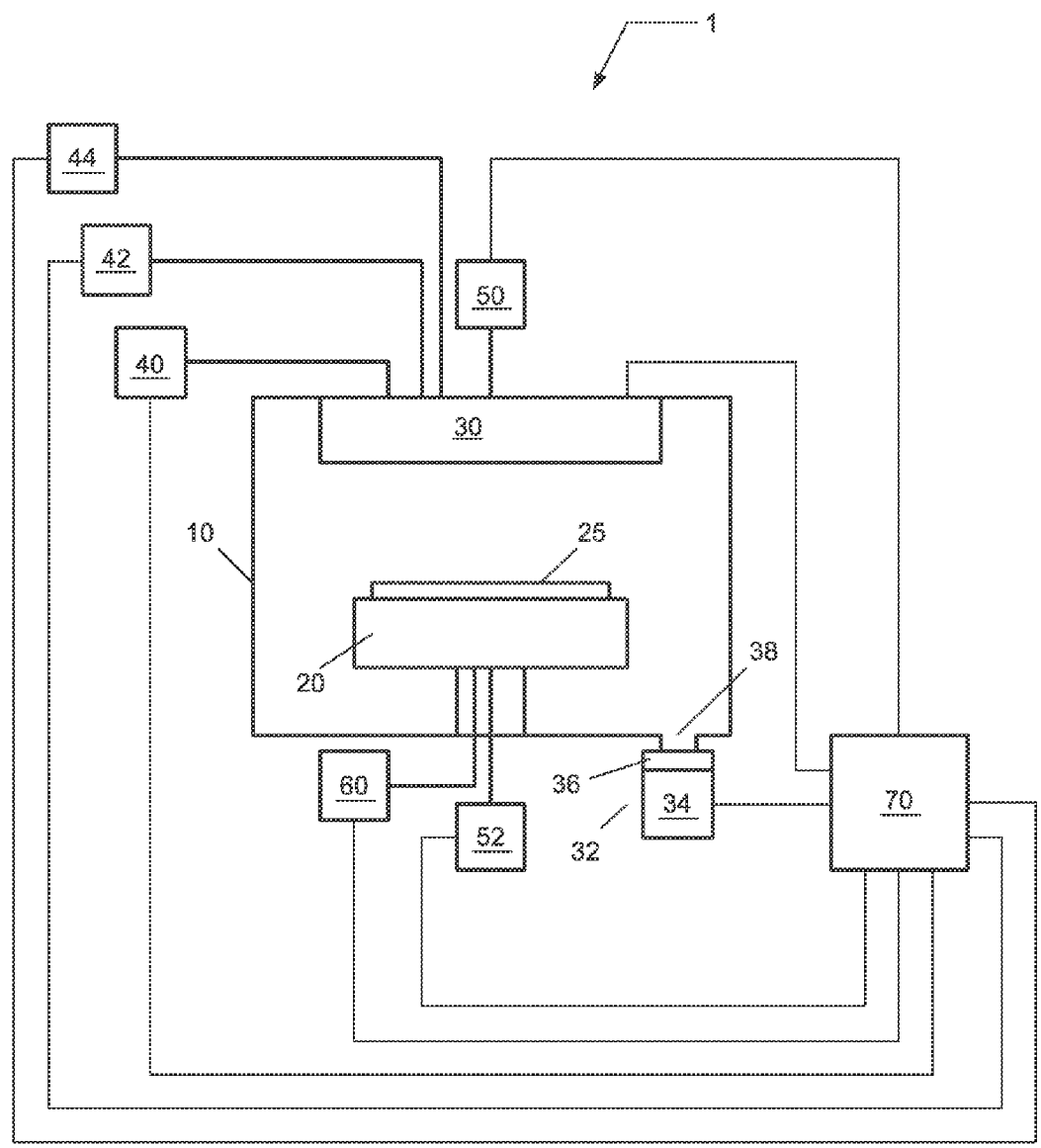
FIG. 5 is a diagrammatic view of a processing system configured for depositing thin films.

FIG. 5 is a diagrammatic view of a processing system configured for depositing thin films. As those skilled in the art will readily recognize, the processing system 1 can be utilized to perform various deposition processes, including CVD, pulsed CVD, plasma-enhanced CVD (PECVD), atomic layer deposition (ALD), or plasma-enhanced ALD (PEALD). The processing system 1 may be used to deposit a diffusion barrier on a patterned structure on a substrate. The processing system 1 includes a process chamber 10 having a substrate holder 20 configured to support a substrate 25 containing the patterned structure upon which the diffusion barrier is to be formed. The process chamber 10 further contains an upper assembly 30 coupled to a first process material supply system 40, a second process material supply system 42, and a purge gas supply system 44. Additionally, the processing system 1 includes a first power source 50 coupled to the process chamber 10 and configured to generate plasma in the process chamber 10, and a substrate temperature control system 60 coupled to substrate holder 20 and configured to elevate and control the temperature of substrate 25.

Still referring to FIG. 5, the processing system 1 may be configured to process 200 mm substrates, 300 mm substrates, or larger-sized substrates. In fact, it is contemplated that the deposition system may be configured to process substrates, wafers, or flat panel displays regardless of their size, as would be appreciated by those skilled in the art. Therefore, while aspects of the invention will be described in connection with the processing of a semiconductor substrate, the invention is not limited solely thereto.

In ALD or PEALD processing, the first process material supply system 40 and the second process material supply system 42 are configured to simultaneously or alternately introduce a first process material and a second process material to the process chamber 10. The alternation of the introduction of the first material and the introduction of the second material can be cyclical, or it may be acyclical with variable time periods between introduction of the first and second materials. The first process material can contain a Ta-, Ti-, or W-containing precursor. For instance, the Ta-, Ti-, or W-containing precursor can originate as a solid phase, a liquid phase, or a gaseous phase, and it may be delivered to process chamber 10 in a gaseous phase with or without the use of a carrier gas. The second process material can, for example, comprise a reducing agent such as $H_2$ or nitriding agents such as $N_2$ and $NH_3$. For instance, the reducing or nitriding agents can originate as a solid phase, a liquid phase, or a gaseous phase, and it may be delivered to process chamber 10 in a gaseous phase with or without the use of a carrier gas.

A wide variety of Ta-, Ti-, or W-containing precursors may be utilized as the first process material. Examples of Ta-containing precursors containing "TaN" intra-molecular bonds include $Ta(NMe_2)_3(NCMe_2Et)$ (TAIMATA), $Ta(NEt_2)_5$ (PDEAT), $Ta(NMe_2)_5$ (PDMAT), $Ta(NEtMe)_5$ (PEMAT), $(tBuN)Ta(NMe_2)_3$ (TBTDMT), $(tBuN)Ta(NEt_2)_3$ (TBTDET), $(tBuN)Ta(NEtMe)_3$ (TBTEMT), and $(iPrN)Ta(NEt_2)_3$ (IPTDET). Examples of Ta-containing precursors containing "Ta—C" intra-molecular bonds, for example $Ta(\eta^5-C_5H_5)_2H_3$, $Ta(CH_2)(CH_3)(\eta^5-C_5H_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3$. Examples of Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Examples of Ti-containing precursors containing "Ti—C" intra-molecular bonds include $Ti(COCH_3)(\eta^5-C_5H_5)_2Cl$, $Ti(\eta^5-C_5H_5)Cl_2$, $Ti(\eta^5-C_5H_5)Cl_3$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti((\eta^5-C_5(CH_3)_5)_2Cl$, $Ti((\eta^5-C_5(CH_3)_5)_2Cl_2$, $Ti(\eta^5-C_5H_5)_2(\mu-Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta-H)_2$, $Ti(\eta^5-C_5(CH_3)_5)_2$, $Ti(\eta^5-C_5(CH_3)_5)_2(H)_2$, and $Ti(CH_3)_2(\eta^5-C_5(CH_3)_5)_2$. One example of a W-containing precursor includes $W(CO)_6$. In the above precursors, the following common abbreviations are used: Me: methyl; Et: ethyl; iPr: isopropyl; and tBu: tert-butyl.

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a noble gas (i.e., helium, neon, argon, xenon, krypton), $N_2$, or $H_2$.

Referring still to FIG. 5, the processing system 1 includes a plasma generation system configured to generate a plasma during at least a portion of the alternating introduction of the first process material and the second process material to process chamber 10. The plasma generation system can include the first power source 50 coupled to the process chamber 10, and configured to couple power to gases in the process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in the process chamber 10 by reducing the reflected power. Match network topologies (e.g. L-type, π-type, T-type, etc.) and automatic control methods are well known to those skilled in the art.

Alternatively, the first power source 50 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "PLASMA PROCESSING APPARATUS FOR ETCHING, ASHING, AND FILM FORMATION," the content of which is herein incorporated by reference in its entirety.

According to one embodiment of the invention, the processing system 1 includes a substrate bias generation system configured to generate or assist in generating a plasma (through substrate holder biasing) during at least a portion of the alternating introduction of the first process material and the second process material to process chamber 10. The substrate bias system can include a substrate power source 52 coupled to the process chamber 10, and configured to couple power to substrate 25. The substrate power source 52 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. In one example, the substrate power source 52 may generate a plasma through biasing of the substrate holder 20 while the upper assembly 30 is grounded.

Although the plasma generation system and the substrate bias system are illustrated in FIG. 5 as separate entities, they may indeed comprise one or more power sources coupled to substrate holder 20.

Still referring to FIG. 5, processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the processing system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming a thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etching, a 300 to 5000 liter per second TMP is generally employed. Moreover, a device for monitoring chamber pressure (not shown) can be coupled to the process chamber 10. The pressure measuring device can, for example, be a capacitance manometer.

The processing system 1 includes a controller 70 than can be used to configure any number of processing elements of the processing system 1, and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs of the processing elements of the processing system 1 as well as monitor outputs from the processing system 1. For example, a program stored in the memory may be utilized to activate the inputs to the aforementioned components of the processing system 1 according to a process recipe in order to perform an etching process, or a deposition process.

The controller 70 may be implemented as a general purpose computer system that performs a portion or all of the microprocessor based processing steps of embodiments of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing embodiments the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

According to embodiments of the invention, a Ru film is deposited on a patterned structure. In one example, the Ru film may be conformally deposited by a thermal CVD process utilizing a $Ru_3CO_{12}$ precursor and a CO carrier gas as described in U.S. patent application Ser. No. 10/996,145, entitled "METHOD AND DEPOSITION SYSTEM FOR INCREASING DEPOSITION RATES OF METAL LAYERS FROM METAL-CARBONYL PRECURSORS".

Figure 6:
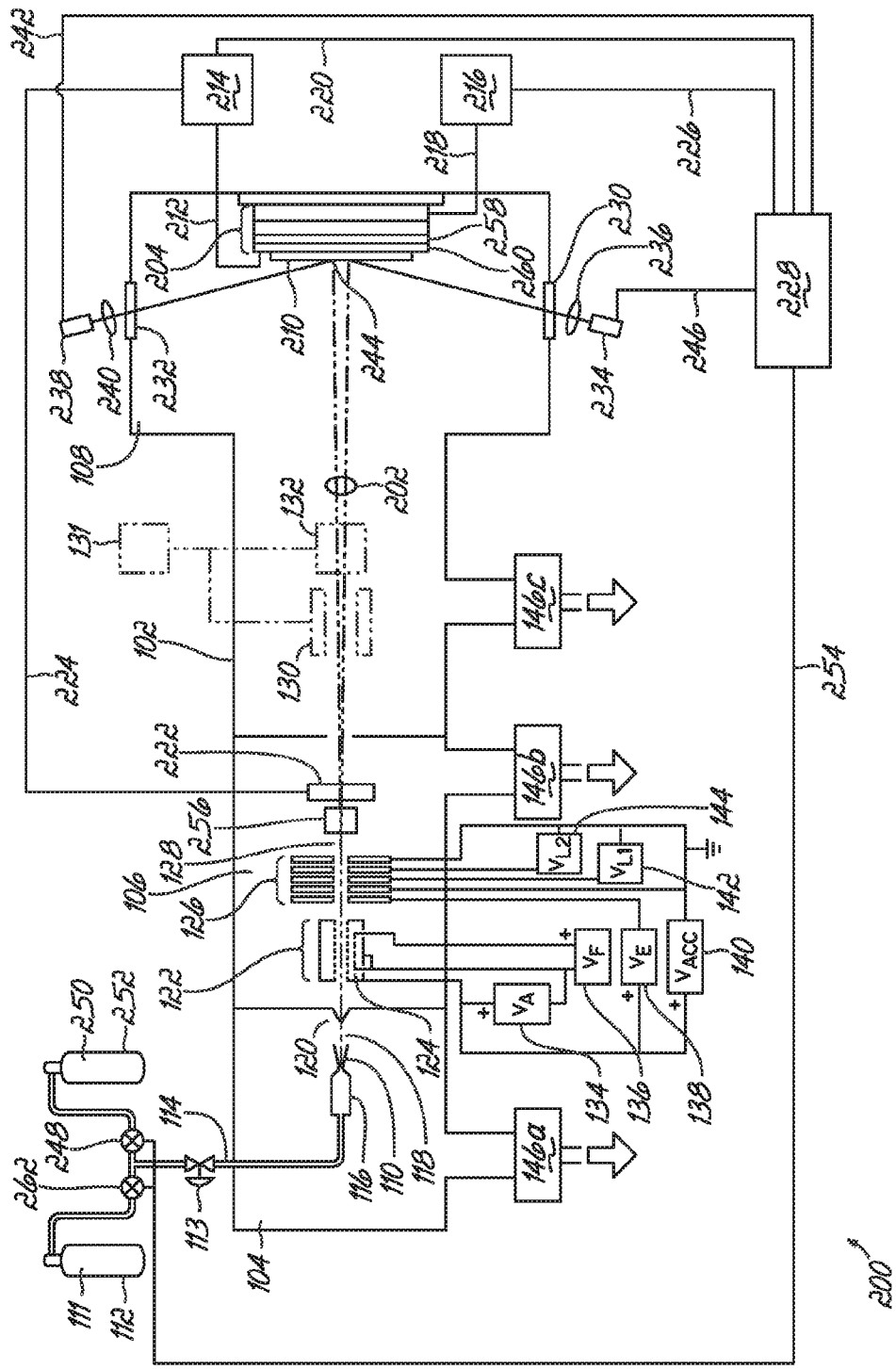
FIG. 6 is a diagrammatic view of a GCIB processing apparatus.

FIG. 6 is a diagrammatic view of a GCIB processing apparatus. The GCIB processing apparatus 200 includes a vacuum vessel 102 divided into communicating chambers that include a source chamber 104, an ionization/acceleration chamber 106, and a processing chamber 108 separated from the source chamber 104 by the ionization/acceleration chamber 106. The chambers 104, 106, 108 are evacuated to suitable operating pressures by vacuum pumping systems 146a, 146b, and 146c, respectively. A condensable source gas 112 from source gas system 111 is admitted under pressure through a gas metering valve 113 and a gas feed tube 114 into a stagnation chamber 116. The source gas 112 is subsequently ejected from the stagnation chamber 116 into the substantially lower pressure vacuum inside the source chamber 104 through a properly shaped nozzle 110. In one example, the stagnation chamber 116 may have the same or similar diameter as the gas feed tube 114. A gas jet 118 results inside the source chamber 104. Cooling, which results from the rapid expansion of the gas jet 118, causes a portion of the gas jet 118 to condense into clusters, each consisting of from several to several thousand weakly bound atoms or molecules.

According to embodiments of the invention, the source gas 112 can contain a transition metal precursor or a rare earth metal precursor. In one embodiment, the transition metal precursor can have low vapor pressure. Exemplary apparatus and method for forming the gas cluster ion beam from a low vapor pressure metal precursor is described in U.S. patent application Ser. No. 11/689,572, titled "APPARATUS AND METHODS OF FORMING A GAS CLUSTER ION BEAM USING A LOW-PRESSURE SOURCE," filed on Mar. 22, 2007, the entire contents of which are hereby incorporated by reference. The source gas 112 can, for example, further include argon (Ar), carbon dioxide ($CO_2$), oxygen ($O_2$), or nitrogen ($N_2$).

Transition metal precursors are available through many chemical vendors. Examples are given below for transition metal precursors containing Ru, Pt, Ir, and Rh, but transition metal precursors containing Sc, Ti, V, Cr, Mn, Fe, Co, Ni, Cu, Zn, Zr, Nb, Mo, Pd, Ag, Cd, Hf, Ta, W, Re, Os, Au, and Hg, are also commercially available. Exemplary Ru precursors include $Ru_3(CO)_{12}$, (2,4-dimethylpentadienyl) (ethylcyclopentadienyl)ruthenium (Ru(DMPD)(EtCp)), bis(2,4-dimethylpentadienyl) ruthenium $(Ru(DMPD)_2)$, 4-dimethylpentadienyl)(methylcyclopentadienyl)ruthenium (Ru(DMPD)(MeCp)), and bis(ethylcyclopentadienyl)ruthenium $(Ru(EtCp)_2)$. Exemplary Pt precursors include $Pt(CO)_2Cl_2$, $Pt(acac)_2$, $Me_2PtC_5H_5$, $Pt(PF_3)_4$, and $MeCpPtMe_3$. Exemplary Ir precursors include $Ir_4(CO)_{12}$, $Ir(allyl)_3$, (methylcyclopentadienyl)(1,5-cyclooctadiene) iridium(I), $(C_6H_7)(C_8H_{12})Ir$, and $IrCl_3$. Exemplary Rh precursors include $Rh(acac)(CO)_2$, $(\eta^5\text{-}C_5H_5)Rh(H_2C=CH_2)_2$, $(\eta^5\text{-}C_5H_5)Rh(CO)_2$, and $RhCl_3$. It will be appreciated by those skilled in the art that a number of different precursor gases can be used without departing from the present invention.

Rare earth metal precursors are available through many chemical vendors. Representative examples of rare earth precursors include:

Y precursors: $Y(N(SiMe_3)_2)_3$, $Y(NiPr_2)_3$, $Y(NtBuSiMe_3)_3$, $Y(TMPD)_3$, $Cp_3Y$, $(MeCp)_3Y$, $(nPrCp)_3Y$, $(nBuCp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(OiPr)_3$.

La precursors: $La(N(SiMe_3)_2)_3$, $La(NiPr_2)_3$, $La(NtBuSiMe_3)_3$, $La(TMPD)_3$, $(iPrCp)_3La$, $Cp_3La$, $Cp_3La(NCCH_3)_2$, $La(Me_2NC_2H_4CP)_3$, $La(THD)_3$, $La[OOCCH(C_2H_5)C_4H_9]_3$, $La(C_{11}H_{19}O_2)_3\cdot CH_3(OCH_2CH_2)_3OCH_3$, $La(C_{11}H_{19}O_2)_3\cdot CH_3(OCH_2CH_2)_4OCH_3$, $La(OiPr)_3$, $La(OEt)_3$, $La(acac)_3$, $La((tBu_2N)_2CMe)_3$, $La((iPr_2N)_2CMe)_3$, $La((tBu_2N)_2CtBu)_3$, $La((iPr_2N)_2CtBu)_3$, and $La(FOD)_3$.

Ce precursors: $Ce(N(SiMe_3)_2)_3$, $Ce(NiPr_2)_3$, $Ce(NtBuSiMe_3)_3$, $Ce(TMPD)_3$, $Ce(FOD)_3$, $(iPrCp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3\cdot CH_3(OCH_2CH_2)_3OCH_3$, $Ce(C_{11}H_{19}O_2)_3\cdot CH_3(OCH_2CH_2)_4OCH_3$, $Ce(OiPr)_3$, and $Ce(acac)_3$.

Pr precursors: $Pr(N(SiMe_3)_2)_3$, $(iPrCp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3\cdot CH_3(OCH_2CH_2)_3OCH_3$, $Pr(OiPr)_3$, $Pr(acac)_3$, $Pr(hfac)_3$, $Pr((tBu_2N)_2CMe)_3$, $Pr((iPr_2N)_2CMe)_3$, $Pr((tBu_2N)_2CtBu)_3$, and $Pr((iPr_2N)_2CtBu)_3$.

Nd precursors: $Nd(N(SiMe_3)_2)_3$, $Nd(NiPr_2)_3$, $(iPrCp)_3Nd$, $Cp_3Nd$, $(C_5Me_4H)_3Nd$, $Nd(THD)_3$, $Nd[OOCCH(C_2H_5)C_4H_9]_3$, $Nd(OiPr)_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $(iPrCp)_3Sm$, $Cp_3Sm$, $Sm(THD)_3$, $Sm[OOCCH(C_2H_5)C_4H_9]_3$, $Sm(OiPr)_3$, $Sm(acac)_3$, and $(C_5Me_5)_2Sm$.

Eu precursors: $Eu(N(SiMe_3)_2)_3$, $(iPrCp)_3Eu$, $Cp_3Eu$, $(Me_4Cp)_3Eu$, $Eu(THD)_3$, $Eu[OOCCH(C_2H_5)C_4H_9]_3$, $Eu(OiPr)_3$, $Eu(acac)_3$, and $(C_5Me_5)_2Eu$.

Gd precursors: $Gd(N(SiMe_3)_2)_3$, $(iPrCp)_3Gd$, $Cp_3Gd$, $Gd(THD)_3$, $Gd[OOCCH(C_2H_5)C_4H_9]_3$, $Gd(OiPr)_3$, and $Gd(acac)_3$.

Tb precursors: $Tb(N(SiMe_3)_2)_3$, $(iPrCp)_3Tb$, $Cp_3Tb$, $Tb(THD)_3$, $Tb[OOCCH(C_2H_5)C_4H_9]_3$, $Tb(OiPr)_3$, and $Tb(acac)_3$.

Dy precursors: $Dy(N(SiMe_3)_2)_3$, $(iPrCp)_3Dy$, $Cp_3Dy$, $Dy(THD)_3$, $Dy[OOCCH(C_2H_5)C_4H_9]_3$, $Dy(OiPr)_3$, $Dy(O_2C(CH_2)_6CH_3)_3$, and $Dy(acac)_3$.

Ho precursors: $Ho(N(SiMe_3)_2)_3$, $(iPrCp)_3Ho$, $Cp_3Ho$, $Ho(THD)_3$, $Ho[OOCCH(C_2H_5)C_4H_9]_3$, $Ho(OiPr)_3$, and $Ho(acac)_3$.

Er precursors: $Er(N(SiMe_3)_2)_3$, $(iPrCp)_3Er$, $(BuCp)_3Er$, $Cp_3Er$, $Er(THD)_3$, $Er[OOCCH(C_2H_5)C_4H_9]_3$, $Er(OiPr)_3$, and $Er(acac)_3$.

Tm precursors: $Tm(N(SiMe_3)_2)_3$, $(iPrCp)_3Tm$, $Cp_3Tm$, $Tm(THD)_3$, $Tm[OOCCH(C_2H_5)C_4H_9]_3$, $Tm(OiPr)_3$, and $Tm(acac)_3$.

Yb precursors: $Yb(N(SiMe_3)_2)_3$, $Yb(NiPr_2)_3$, $(iPrCp)_3Yb$, $Cp_3Yb$, $Yb(THD)_3$, $Yb[OOCCH(C_2H_5)C_4H_9]_3$, $Yb(OiPr)_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $(iPrCp)_3Lu$, $Cp_3Lu$, $Lu(THD)_3$, $Lu[OOCCH(C_2H_5)C_4H_9]_3$, $Lu(OiPr)_3$, and $Lu(acac)_3$.

In the above precursors, the following common abbreviations are used: Me: methyl; Et: ethyl; iPr: isopropyl; nPr: n-propyl; Bu: butyl; nBu: n-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

A gas skimmer aperture 120 situated between the source chamber 104 and ionization/acceleration chamber 106 partially separates any gas molecules that have not condensed into clusters from those that have condensed and become part of the gas jet 118. The removal of the un-condensed gas molecules minimizes pressure increases in the downstream regions where such higher pressures would be detrimental, such as in the ionization/acceleration chamber 106 near ionizer 122 and high voltage electrodes 126 and in the processing chamber 108.

After the gas jet 118 has been formed in the source chamber 104, the constituent gas clusters in gas jet 118 are ionized by ionizer 122. The ionizer 122 is typically an electron impact ionizer that produces electrons from one or more filaments 124 and accelerates and directs the electrons causing them to collide with the gas clusters in the gas jet 118 inside the ionization/acceleration chamber 106. The electron impact ejects electrons from molecules in the gas clusters to generate ionized molecules and thereby endows the gas clusters with a net positive charge to define cluster ions. A filament power supply 136 provides voltage $V_F$ to heat the ionizer filament 124.

A set of suitably biased high voltage electrodes 126 in the ionization/acceleration chamber 106 extracts the cluster ions from the ionizer 122. The high voltage electrodes 126 then accelerate the extracted cluster ions to a desired energy and focus them to define the GCIB 128. The kinetic energy of the cluster ions in GCIB 128 typically ranges from 1 thousand electron volts (keV) to several tens of keV. Anode power supply 134 provides voltage $V_A$ to at least one of the high voltage electrodes 126 for accelerating electrons emitted from filament 124 and causing the electrons to bombard the gas clusters in gas jet 118, which produces cluster ions.

Extraction power supply 138 provides voltage $V_E$ to bias at least one of the high voltage electrodes 126 to extract ions from the ionizing region of ionizer 122 and to form the GCIB 128. Accelerator power supply 140 provides voltage $V_{Acc}$ to bias one of the high voltage electrodes 126 with respect to the ionizer 122 so as to result in a total GCIB acceleration energy determined by the $V_{Acc}$. Lens power supplies 142, 144 may be provided to bias some of the high voltage electrodes 126 with potentials (e.g., $V_{L1}$ and $V_{L2}$) to focus the GCIB 128. A beam filter 256 in the ionization/acceleration chamber 106 eliminates monomers or monomers and light cluster ions from the GCIB 128 to define a GCIB 202 that enters the processing chamber 108.

A beam gate 222 is disposed in the path of GCIB 128 in the ionization/acceleration chamber 106. Beam gate 222 has an open state in which the GCIB 128 is permitted to pass from the ionization/acceleration chamber 106 to the processing chamber 108 to define GCIB 202 and a closed state in which the GCIB 128 is blocked from entering the processing chamber 108. A control cable 224 conducts control signals from dosimetry processor 214 to beam gate 222. The control signals controllably switch beam gate 222 to between the open or closed states.

A work piece 210, which may be a semiconductor wafer or other substrate to be processed by GCIB processing, is disposed in the path of the GCIB 202 in the processing chamber 108. Because most applications contemplate the processing of large work pieces 210 with spatially uniform results, a scanning system may be desirable to uniformly scan the GCIB 202 across large areas to produce spatially homogeneous results.

The GCIB 202 directed at the work piece 210 may be substantially stationary (i.e., un-scanned). Work piece 210 is held in the processing chamber 108 on a X-Y positioning table 204 operable to move the work piece 210 in two axes, effectively scanning the work piece 210 relative to the GCIB 202. The GCIB 202 impacts the work piece 210 at a projected impact region 244 on a surface of the work piece 210. By X-Y motion, the X-Y positioning table 204 can position each portion of a surface of the work piece 210 in the path of GCIB 202 so that every region of the surface may be made to coincide with the projected impact region 244 for processing by the GCIB 202. An X-Y controller 216 provides electrical signals to the X-Y positioning table 204 through an electrical cable 218 for controlling the position and velocity in each of X-axis and Y-axis directions. The X-Y controller 216 receives control signals from, and is operable by, system controller 228 through an electrical cable 226. X-Y positioning table 204 moves by continuous motion or by stepwise motion according to conventional X-Y table positioning technology to position different regions of the work piece 210 within the projected impact region 244. In one embodiment, X-Y positioning table 204 is programmably operable by the system controller 228 to scan, with programmable velocity, any portion of the work piece 210 through the projected impact region 244 for GCIB processing by the GCIB 202.

Alternatively, orthogonally oriented electrostatic scan plates 130,132 can be utilized to produce a raster or other scanning pattern of the GCIB 202 across the desired processing area on work piece 210, instead of or in addition to using positioning table 204. When beam scanning is performed, a scan generator 131 provides X-axis and Y-axis scanning signal voltages to the scan plates 130, 132. The scanning signal voltages provided to the scan plates 130, 132 may be triangular waves of different frequencies that cause the GCIB 202 to scan the entire surface of work piece 210.

The work piece holding surface 260 of positioning table 204 is electrically conductive and is connected to a dosimetry processor 214 by an electrical lead 212. An electrically insulating layer 258 of positioning table 204 isolates the work piece 210 and work piece holding surface 260 from the other portions of the positioning table 204. Electrical charge induced in the work piece 210 by the impinging GCIB 202 is conducted through work piece 210, work piece holding surface 260, and electrical lead 212 to the dosimetry processor 214 for measurement. Dosimetry processor 214 has integrating means for integrating the GCIB current to determine a GCIB processing dose. Under certain circumstances, a target-neutralizing source (not shown) of electrons, sometimes referred to as electron flood, may be used to neutralize the GCIB 202. In such case, a Faraday cup (not shown) may be used to assure accurate dosimetry despite the added source of electrical charge.

The processing chamber 108 includes optical windows 230 and 232. An optical transmitting transducer 234, which may also have additional transmitting optics 236, and an optical receiving transducer 238, which may also have additional receiving optics 240, form a conventional optical instrumentation system. The transmitting transducer 234 receives, and is responsive to, controlling electrical signals from the system controller 228 communicated through an electrical cable 246. The transmitting transducer 234 directs an optical beam through the optical window 230 toward the work piece 210. The receiving transducer 238 detects the optical beam through optical window 232. The receiving transducer 238 sends measurement signals to the system controller 228 through an electrical cable 242.

The optical instrumentation system may comprise any of a variety of different instruments for tracking the progress of the GCIB processing. For example, the optical instrumentation system may constitute a spectroscopic ellipsometry system for measuring or mapping the thickness of the upper film layer on the work piece 210. As another example, the optical instrumentation system may comprise a scatterometer for measuring or mapping the thickness of the layer on the work piece surface. By operating under control of the system controller 228 and in conjunction with the X-Y positioning table 204, the optical instrumentation can map one or more characteristics of the work piece 210.

In addition to source gas system 111, the GCIB processing apparatus 200 has a gas cylinder 250 for containing an additional source gas 252, which may be, for example, oxygen, nitrogen, carbon dioxide, nitric oxide, nitrous oxide, another oxygen-containing condensable gas, or sulfur hexafluoride. Shut-off valves 262 and 248 are operable by signals transmitted through electrical cable 254 by system controller 228 to select source gas 112 and optionally source gas 252 for GCIB processing.

The dosimetry processor 214 may be one of many conventional dose control circuits that are known in the art and may include, as a part of its control system, all or part of a programmable computer system. The X-Y controller 216 may include as part of its logic all, or part of, a programmable computer system. The dosimetry processor 214 may include as part of its logic all, or part of, a programmable computer system. Some or all of the logic of the X-Y controller 216 and dosimetry processor 214 may be performed by a small general purpose computer that also controls other portions of the GCIB processing apparatus 200, including the system controller 228.

In operation, the dosimetry processor 214 signals the opening of the beam gate 222 to irradiate the work piece 210 with the GCIB 202. The dosimetry processor 214 measures the GCIB current collected by the work piece 210 to compute the accumulated dose received by the work piece 210. When the dose received by the work piece 210 reaches a predetermined required dose, the dosimetry processor 214 closes the beam gate 222 and processing of the work piece 210 is complete.

The dosimetry processor 214 is electrically coupled with the system controller 228 by an electrical cable 220. During processing of the work piece 210, the dose rate is communicated by the dosimetry processor 214 to the system controller 228 by electrical signals transmitted over electrical cable 220. The system controller 228 analyzes the electrical signals to, for example, confirming that the GCIB beam flux is substantially constant or to detect variations in the GCIB beam flux. The X-Y controller 216 is responsive to electrical signals from the system controller 228 that are transmitted over an electrical cable 226. The X-Y controller 216 can scan the X-Y positioning table to position every part of the work piece 210 for processing according to predetermined velocities that result appropriate beam dwell times to deposit material to the desired local thicknesses effective to provide a film of substantially uniform thickness.

As an alternative method, the GCIB 202 may be scanned at a constant velocity in a fixed pattern across the surface of the work piece 210, but the GCIB intensity is modulated (often referred to as Z-axis modulation) to deliver an intentionally non-uniform dose to the sample. The GCIB intensity may be modulated in the GCIB processing apparatus 200 by any of a variety of methods, including varying the gas flow from a GCIB source supply; modulating the ionizer by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

A plurality of embodiments for formation of an electrical contact for integrated circuits using gas cluster ion beam processing has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a first layer "on" a second layer is directly on and in immediate contact with the second layer unless such is specifically stated; there may be a third layer or other structure between the first layer and the second layer on the first layer.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming an electrical contact for an integrated circuit, the method comprising:
    providing a patterned structure containing a micro-feature formed in a dielectric material and a conductive layer at the bottom of the micro-feature;
    depositing a diffusion barrier on the patterned structure, including along a sidewall of the micro-feature and on the conductive layer;
    exposing the diffusion barrier on the patterned structure to a gas cluster ion beam containing a precursor compound of a transition metal or a rare earth metal, wherein the precursor compound undergoes a decomposition reaction upon exposure to the dielectric barrier to thereby incorporate the transition metal or the rare earth metal into the diffusion barrier to form a fused metal-containing layer; and
    forming bulk Cu metal in the micro-feature.

2. The method of claim 1, further comprising:
    depositing a Ru film on the fused metal-containing layer.

3. The method of claim 2, further comprising:
    exposing the Ru film on the fused metal-containing layer to a second gas cluster ion beam containing a second precursor compound of the transition metal or the rare earth metal, wherein the second precursor compound undergoes a decomposition reaction upon exposure to the Ru film to thereby incorporate the transition metal or the rare earth metal into the Ru film to form a second fused metal-containing layer.

4. The method of claim 1, comprising:
    at least substantially etching the diffusion barrier from the conductive layer before the exposing,
    wherein exposing the diffusion barrier on the patterned structure to a gas cluster ion beam further exposes the conductive layer to the gas cluster ion beam to incorporate the transition metal or the rare earth metal into the conductive layer to further form the fused metal-containing layer.

5. The method of claim 4, further comprising:
    depositing a Ru film on the fused metal-containing layer.

6. The method of claim 5, further comprising:
    exposing the Ru film on the fused metal-containing layer to a second gas cluster ion beam containing a second precursor compound of the transition metal or the rare earth metal, wherein the second precursor compound undergoes a decomposition reaction upon exposure to the Ru film to thereby incorporate the transition metal or the rare earth metal into the Ru film to form a second fused metal-containing layer on the fused metal-containing layer.

7. A method for forming an electrical contact for an integrated circuit, the method comprising:
    providing a patterned structure containing a micro-feature formed in a dielectric material and a conductive layer at the bottom of the micro-feature;
    depositing a diffusion barrier on the patterned structure, including along a sidewall of the micro-feature and on the conductive layer;
    depositing a Ru film on the diffusion barrier;
    exposing the Ru film to a gas cluster ion beam containing a precursor compound of a transition metal or a rare earth metal, wherein the precursor compound undergoes a decomposition reaction upon exposure to the Ru film to thereby incorporate the transition metal or the rare earth metal into the Ru film to form a fused metal-containing layer; and
    forming bulk Cu metal in the micro-feature.

8. The method of claim 7, further comprising:
    at least substantially etching the diffusion barrier and the Ru film from the conductive layer before the exposing,
    wherein exposing the Ru film to a gas cluster ion beam further incorporates the transition metal or the rare earth metal into the conductive layer to further form the fused metal-containing layer.

9. The method of claim 7, further comprising, before depositing the Ru film, at least substantially etching the diffusion barrier from the conductive layer, and wherein depositing the Ru film further comprises depositing the Ru film on the conductive layer.

* * * * *

UNITED STATES PATENT AND TRADEMARK OFFICE
CERTIFICATE OF CORRECTION

PATENT NO.        : 7,772,110 B2
APPLICATION NO. : 11/864334
DATED             : August 10, 2010
INVENTOR(S)       : Rodney L. Robison et al.

It is certified that error appears in.0 the above-identified patent and that said Letters Patent is hereby corrected as shown below:

Col. 4, line 37, "combination thereof." should read --combination thereof).--.

Col. 12, line 51, "than can" should read --that can--.

Col. 13, line 38, "embodiments the invention," should read --embodiments of the invention,--.

Col. 18, line 61, "for example, confirming" should read --for example, confirm--.

Col. 19, line 1, "result appropriate" should read --result in appropriate--.

Col. 19, line 54, Claim 1, "dielectric barrier" should read --diffusion barrier--.

Signed and Sealed this

Twenty-sixth Day of October, 2010

David J. Kappos
*Director of the United States Patent and Trademark Office*